(12) United States Patent
Belton et al.

(10) Patent No.: US 9,140,768 B2
(45) Date of Patent: Sep. 22, 2015

(54) VIBRATION ISOLATION FOR SUPERCONDUCTING MAGNETS

(71) Applicants: Neil Belton, Didcot (GB); Richard Gowland, Bicester (GB); Trevor Bryan Husband, Kidlington (GB); Nicholas Mann, Compton (GB); Michael Simpkins, High Wycombe (GB)

(72) Inventors: Neil Belton, Didcot (GB); Richard Gowland, Bicester (GB); Trevor Bryan Husband, Kidlington (GB); Nicholas Mann, Compton (GB); Michael Simpkins, High Wycombe (GB)

(73) Assignee: Siemens PLC, Camberley (GB)

( * ) Notice: Subject to any disclaimer, the term of this patent is extended or adjusted under 35 U.S.C. 154(b) by 0 days.

(21) Appl. No.: 14/363,394

(22) PCT Filed: Nov. 19, 2012

(86) PCT No.: PCT/EP2012/073010
§ 371 (c)(1),
(2) Date: Jun. 6, 2014

(87) PCT Pub. No.: WO2013/083394
PCT Pub. Date: Jun. 13, 2013

(65) Prior Publication Data
US 2014/0357494 A1    Dec. 4, 2014

(30) Foreign Application Priority Data
Dec. 8, 2011   (GB) .................................. 1121146.3

(51) Int. Cl.
*H01F 3/00*    (2006.01)
*G01R 33/385*    (2006.01)
(Continued)

(52) U.S. Cl.
CPC ........ *G01R 33/3854* (2013.01); *G01R 33/3802* (2013.01); *G01R 33/3815* (2013.01); *H01F 6/00* (2013.01)

(58) Field of Classification Search
CPC ............. F16F 6/00; F16F 7/00; F16F 15/005; F16F 15/03; F16F 2222/06
USPC .......................................................... 335/296
See application file for complete search history.

(56) References Cited

U.S. PATENT DOCUMENTS 2,923,505 A * 2/1960 Immendorf .................... 248/561
3,540,088 A * 11/1970 Simpson et al. ............... 248/561
(Continued)

FOREIGN PATENT DOCUMENTS

EP    1 085 336    3/2001
GB    2 457 899    9/2009
(Continued)

OTHER PUBLICATIONS

Xue Tingqiang et al. "Development of Mobile MRI System," Chinese Journal of Medical Intrumentation vol. 34, No. 3, (2010) pp. 195-197.
(Continued)

*Primary Examiner* — Shawki S Ismail
*Assistant Examiner* — Lisa N Homza
(74) *Attorney, Agent, or Firm* — Schiff Hardin LLP (57) ABSTRACT

A mounting plate for locating under a superconducting magnet structure, between the superconducting magnet structure and a supporting surface of a mobile carrier, is controllable between two different states. In a first state, the mount provides rigid attachment and precise location of the superconducting magnet structure onto the supporting surface of the mobile carrier. In a second state, the mount provides vibration isolation between the superconducting magnet and the mobile carrier.

13 Claims, 7 Drawing Sheets

(51) Int. Cl.
 *G01R 33/38* (2006.01)
 *G01R 33/3815* (2006.01)
 *H01F 6/00* (2006.01)

(56) References Cited

U.S. PATENT DOCUMENTS

| | | | |
|---|---|---|---|
| 3,908,940 A * | 9/1975 | Van Der Stricht | 248/561 |
| 3,912,207 A * | 10/1975 | Gauer | 248/561 |
| 4,148,260 A * | 4/1979 | Minovitch | 104/138.1 |
| 4,403,763 A * | 9/1983 | Dold | 248/561 |
| 4,485,998 A * | 12/1984 | Kowalski et al. | 248/561 |
| 4,513,939 A * | 4/1985 | Berger et al. | 248/544 |
| 4,598,503 A * | 7/1986 | Berger et al. | 52/27 |
| 4,736,555 A * | 4/1988 | Nagare et al. | 52/126.6 |
| 4,755,754 A * | 7/1988 | Sireul et al. | 324/318 |
| 4,777,807 A * | 10/1988 | White | 62/51.1 |
| 4,803,433 A | 2/1989 | McBride | |
| 5,083,845 A * | 1/1992 | Sparks et al. | 312/228 |
| 5,343,180 A * | 8/1994 | Fukumoto et al. | 335/216 |
| 5,495,221 A * | 2/1996 | Post | 335/299 |
| 5,915,662 A * | 6/1999 | Itakura et al. | 248/561 |
| 5,953,996 A * | 9/1999 | Powell et al. | 104/281 |
| 6,128,522 A * | 10/2000 | Acker et al. | 600/411 |
| 6,209,843 B1 * | 4/2001 | Smith, Jr. | 248/561 |
| 6,252,404 B1 * | 6/2001 | Purgill et al. | 324/318 |
| 6,828,792 B1 * | 12/2004 | Danby et al. | 324/318 |
| 6,954,068 B1 * | 10/2005 | Takamori et al. | 324/318 |
| 8,056,880 B2 * | 11/2011 | Tsuchida | 248/638 |
| 2001/0010464 A1 * | 8/2001 | Takamori et al. | 324/304 |
| 2003/0048163 A1 * | 3/2003 | Watanabe et al. | 335/299 |
| 2003/0076205 A1 * | 4/2003 | Wang et al. | 335/299 |
| 2003/0085705 A1 | 5/2003 | Dewdney | |
| 2003/0112106 A1 * | 6/2003 | Watanabe et al. | 335/299 |
| 2004/0174167 A1 * | 9/2004 | Kitagawa et al. | 324/318 |
| 2004/0178792 A1 * | 9/2004 | Edelstein | 324/318 |
| 2006/0202694 A1 | 9/2006 | Maeda et al. | |
| 2009/0279260 A1 * | 11/2009 | Yu | 361/702 |

FOREIGN PATENT DOCUMENTS

| | | |
|---|---|---|
| JP | 2001128962 | 5/2001 |
| JP | 2010005472 | 1/2010 |
| WO | 2005/111726 | 11/2005 |
| WO | 2010/146482 | 12/2010 |

OTHER PUBLICATIONS

Maple et al., "A Platform for Vibration Damping, Leveling, and Height Control of High-Resolution Superconducting Magnets," Journal of Magnetic Resonance, vol. 82 No. 2, (1989) pp. 382-386.

* cited by examiner

VIBRATION ISOLATION FOR SUPERCONDUCTING MAGNETS

BACKGROUND OF THE INVENTION

1. Field of the Invention

The present invention relates to superconducting magnets which are transported and operated within a mobile carrier, such as a road trailer, railway carriage, or shipping container.

2. Description of the Prior Art

Superconducting magnets, particularly superconducting magnets used as part of a magnetic resonance imaging (MRI) or nuclear magnetic resonance (NMR) imaging system need to be held stably within their carrier, so that the magnet system is immobile during use as part of an imaging system.

An example of such arrangements is the mobile MRI system, which may travel up to 500,000 miles (800,000 km) during its working life. The superconducting magnets of such systems are transported "at field", that is to say, having electric current flowing in the superconducting magnet and generating a magnetic field. The typical use for such a system is to provide an imaging facility in a town which does not otherwise have such a facility, for a few days, and then to move on to another town, following a circuit. Another example of a relevant system is the transportable MRI system, which may typically travel up to 50,000 miles (80,000 km) during its working life. These magnets are not transported "at field". The current flowing in the magnet is removed prior to transport, and no magnetic field is generated while the magnet is being moved.

In each case, the mobile carrier contains a significant quantity of shielding, typically iron or steel sheets lining the mobile carrier to limit the strength of magnetic field which escapes through the carrier into the surrounding environment. Many countries have strict limits on the permissible strength of such "stray field".

To perform an imaging function, the superconducting magnet must generate a strong magnetic field of high homogeneity within an imaging region. The magnet must not move during the imaging procedure. In the context of the above-described superconducting magnets within mobile carriers, this means that the magnet must be rigidly affixed to the mobile carrier when in use for imaging, and must be precisely located in its designed position, to ensure that the shielding performs its function of limiting stray field but does not degrade the homogeneity of the magnetic field in the imaging region. If the magnet were to be positioned even 1 mm away from its design position, the shielding would distort the magnetic field and degrade the images produced. The surest way to achieve these aims of rigid fixing and repeatable positioning is of course to attach the magnet firmly, rigidly and permanently to the mobile carrier. However, this is found unacceptable because the relatively fragile nature of the supporting structure of a typical superconducting magnet needs to be protected from shock loads experienced by the mobile carrier during transport. This may be addressed by providing vibration isolating mounts for the superconducting magnet structure, to prevent the superconducting magnet structure from experiencing the full shock loads. An alternative is to make the supporting structure much stronger to withstand the shock loads, which will in turn lead to greater heat influx to the superconducting magnet, greater costs of cooling equipment or cooling cryogen materials.

UK patent GB2456795 describes a magnetically actuated motion limiter for limiting the motion of a cryogen vessel within an outer vacuum chamber.

SUMMARY OF THE INVENTION

An object the present invention addresses is to provide a rigid and stable mounting for the superconducting magnet when in use as part of an imaging system, while also providing effective isolation from shock loads during transportation.

As noted above, according to the present invention, mounting points are provided for locating under the superconducting magnet, between the magnet and a supporting surface of the mobile carrier. The mounting points of the present invention are controllable between two different states. In a first state, the mount provides rigid attachment and precise location of the superconducting magnet onto the supporting surface of the mobile carrier. In a second state, the mount provides vibration isolation between the superconducting magnet and the mobile carrier. Transition between the two states may be manually actuated, may be powered, or may be interlocked with systems of a tractor unit driving the mobile carrier.

DESCRIPTION OF THE PREFERRED EMBODIMENTS

According to the present invention, mounting points are provided for locating under the superconducting magnet, between the magnet and a supporting surface of the mobile carrier. The mounting points of the present invention are controllable between two different states. In a first state, the mount provides rigid attachment and precise location of the superconducting magnet onto the supporting surface of the mobile carrier. In a second state, the mount provides vibration isolation between the superconducting magnet and the mobile carrier. Transition between the two states may be manually actuated, may be powered, or may be interlocked with systems of a tractor unit driving the mobile carrier. It is important that the magnet should return to exactly the same position each time that the mounting points are placed in their first state. This ensures that the shielding will have the same effect on the magnetic field in the imaging region each time, and so the homogeneity of the magnetic field in the imaging region will be repeatable. For mobile systems, where the magnet is transported at field, there will be forces acting between the magnet structure and the shielding which may urge the magnet to move. The mounting points of the present invention must overcome this tendency, and ensure accurate re-positioning of the superconducting magnet structure each time. Typically, a mounting point of the present invention may allow the superconducting magnet structure to move by up to 10 mm in any direction.

Figure 1:
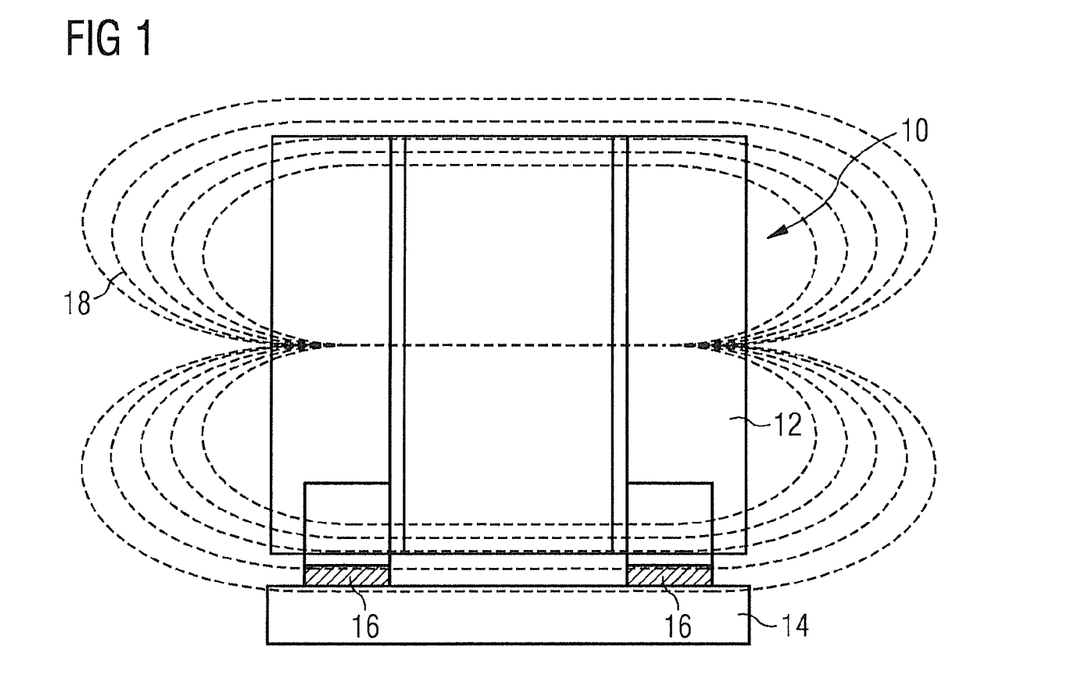
FIG. 1 shows an example cylindrical superconducting magnet structure 10.

FIG. 1 schematically illustrates an example cylindrical superconducting magnet structure 10, itself comprising the outer vacuum chamber (OVC) 12, visible in the drawing, coils of superconducting wire and cooling arrangements to cool the coils to a temperature low enough that they are superconductive. Such cooling arrangements may comprise an electromechanically operated refrigerator, boiling liquid cryogen or a combination of these arrangements.

A pallet 14 is shown. The pallet may be used to help with handling the magnet, locating it within a mobile carrier, or for transportation between locations. According to an embodiment of the present invention, the pallet 14 incorporates mounting points 16 of the present invention, which support a superconducting magnet 10 when carried by the pallet. In other embodiments, the mounting points 16 do not form part of the pallet, but are positioned between the pallet and the superconducting magnet. In other embodiments, no pallet is provided, and mounting points according to the present invention are positioned between the superconducting magnet 10 and the supporting surface of the mobile carrier.

FIG. 1 also schematically illustrates lines 18 of magnetic flux, representing a magnetic field generated by the superconducting magnet 10 in use, a strong magnetic field being generated within the bore of the magnet, and a much weaker stray field extending axially and radially outside of the magnet.

The present invention does not relate to the particular structure of the superconducting magnet, or the operation of the imaging system, other than in regard to the constraints it places on the mounting points 16 for the superconducting magnet.

As mentioned above, the present invention provides mounting points for supporting superconducting magnets on a supporting surface of a mobile carrier. The mounting points have a first state in which the mount provides rigid attachment and precise location of the superconducting magnet onto the supporting surface of the mobile carrier, and a second state in which, the mount provides vibration isolation between the superconducting magnet and the mobile carrier.

A first set of embodiments provides examples in which conventional vibration isolators, such as rubber blocks and/or metal springs or dampers are provided with a separate mechanical lock mechanism.

Figure 2A:
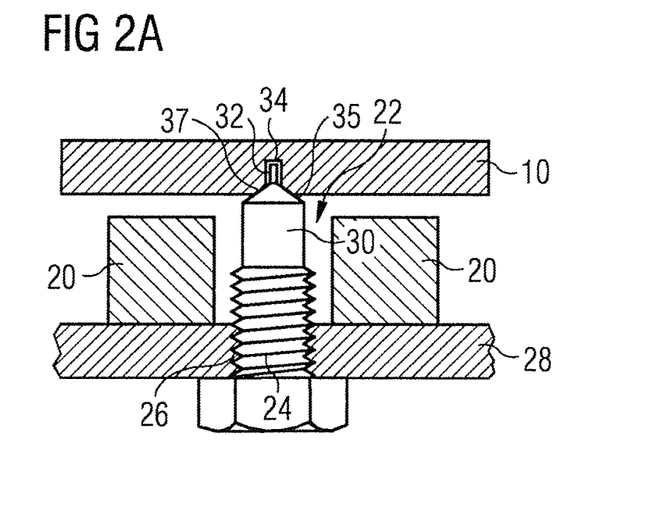
FIGS. 2A, 2B show an example embodiment of the present invention.
Figure 2B:
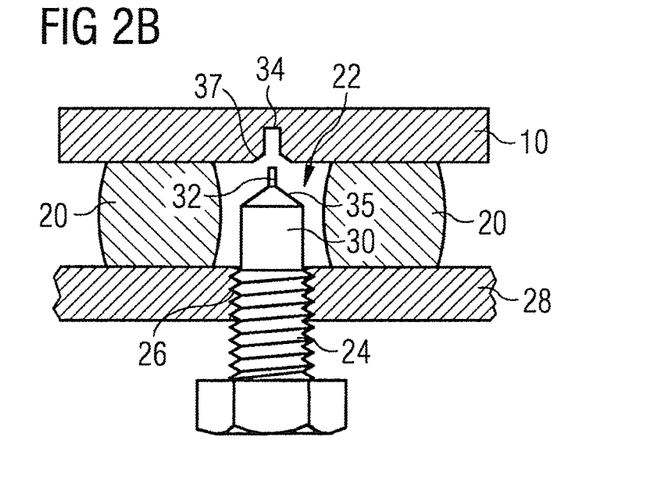

A first example embodiment of a mounting point according to the present invention is schematically illustrated in FIGS. 2A-2B. FIG. 2A shows the mounting point in its first state, providing rigid attachment, while FIG. 2B shows the mounting point in its second state, providing vibration isolation.

According to this embodiment, an anti-vibration mount 20 is provided, surrounding a rigid mount 22. "Surrounding" may mean encircling, positioned either side of, or positioned at selected locations around. Rigid mount 22 comprises a threaded drive screw 24 passing through a complementary threaded hole 26 in a support 28, arranged such that the lower extremity of the drive screw 24 is accessible, and support 28 is itself rigidly mounted to the supporting surface of the mobile carrier. Drive screw 24 drives a driven piece 30 vertically past the anti-vibration mount 20. The driven piece may be a rigid block, profiled to prevent rotation, which is driven in the vertical direction by rotation of drive screw 24. Alternatively, the driven piece may simply be an extension of the drive screw.

In alternative arrangements the anti-vibration mount may be surrounded by the rigid mount, which may itself be composed of several parts, each as shown in FIGS. 2A-2B, or their equivalents.

The drive screw may be operated manually or by any suitable powered actuation system such as electric, pneumatic, or hydraulic systems, which may be conventional in themselves.

The anti-vibration mounts may themselves be of conventional type for example, using rubber blocks, or elastomeric or metal springs or dampers. In the first state, shown in FIG. 2A, drive screw 24 has been driven to its vertically uppermost position, and the driven piece 30 protrudes above the anti-vibration mount 20. The superconducting magnet structure 10 bears upon the driven piece, and provides rigid mounting. In its second state, illustrated in FIG. 2B, the drive screw 24 is retracted to a lower position, out of contact with the superconducting magnet structure 10. The superconducting magnet structure 10 rests on anti-vibration mount 20.

It is necessary, when the mount is in its first state (FIG. 2A), that the magnet is positioned to within a very close tolerance, typically 1 mm, of its design position, to ensure that the homogeneity of the magnetic field within the imaging region is not degraded by a change of position as compared to shielding carried by the mobile carrier. This may be aided by providing an alignment pin 32 on an upper extremity of driven piece 30, which engages with a complementary recess 34 in the superconducting magnet structure 10. Alternatively, or in addition, a taper 35 may be provided on the driven piece, with a complementary recess 37 formed on the superconducting magnet structure 10. In each case, the roles may be reversed, with pin or tapered protrusion being formed on the superconducting magnet and the complementary recess being formed on the driven piece 30. A lubricant grease may be provided between the magnet structure 10 and driven piece 30.

Figure 3A:
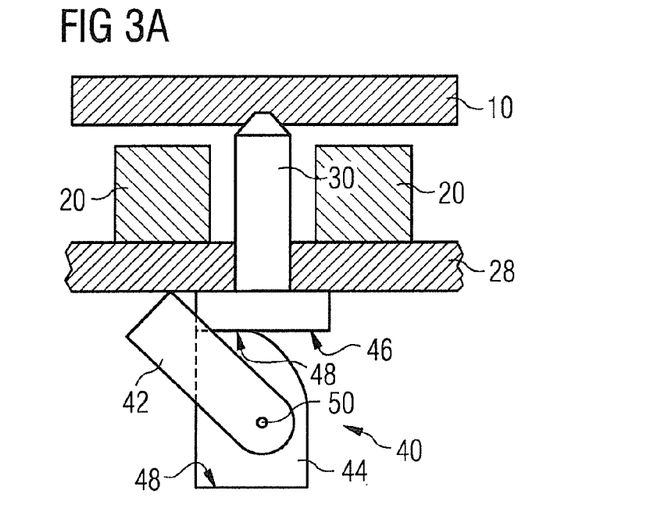
FIGS. 3A, 3B show an example embodiment of the present invention.
Figure 3B:
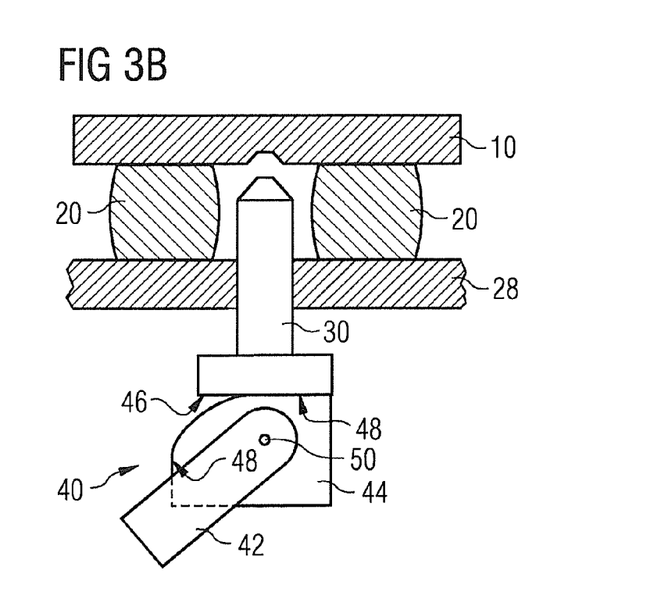
Figure 3C:
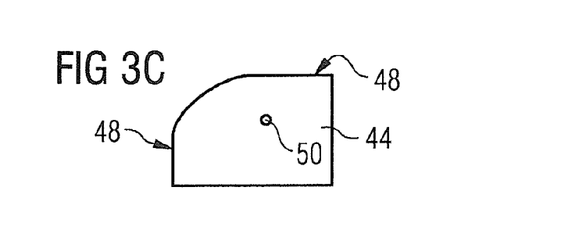
FIG. 3C shows a cam useful in the embodiment of FIGS. 3A-3B.

FIGS. 3A, 3B illustrate a variation of the embodiment of FIGS. 2A-2B, in which the drive screw of FIGS. 2A-2B is replaced by a cam mechanism 40, which may be manually operated using lever 42 to rotate cam 44 to bear upon a drive surface 46 of driven piece 30. In its first state, cam 44 drives the driven piece 30 to a vertically uppermost position as illustrated in FIG. 3A, such that the superconducting magnet structure 10 bears upon the drive piece 30 as a rigid mount. In its second state, cam 44 drives the driven piece to a vertically lower position as illustrated in FIG. 3B, such that the superconducting magnet structure bears upon the anti-vibration mount 20. A retainer should be provided to ensure that the cam 44 stays in position unless a user decides to move it. This retainer may take the form of specific profiling of the cam, for example as shown at 48 in FIG. 3C. The axis 50 of the cam may be mounted to the support 28. The drive surface 46 of driven piece 30 may be the underside of the driven piece, or a surface of a protrusion or recess provided for the purpose. The cam may be operated manually or by any suitable powered actuation system such as electric, pneumatic, hydraulic arrangements, which may be conventional in themselves.

In further variations of the embodiments shown in FIGS. 2A, 2B, 3A, 3B, the driven piece may be the anti-vibration mount, while the rigid support may be immobile. Alternatively, or in addition, a central piece of the mount may be immobile, while surrounding pieces may be driven vertically by one or more screw or cam arrangements.

As discussed above, some types of superconducting magnets are transported at field, while others are de-energized before transport. FIG. 1 schematically illustrates a stray field which may be generated by a transportable superconducting magnet when at field. Such "transportable" magnets, which are not transported at field, may be provided with mounting points according to an embodiment of the present invention which are actuated by a stray field generated by the superconducting magnet when at field. In an example of this type of embodiment, illustrated in FIGS. 5A and 5B, a cam operated mounting point similar to that illustrated in FIGS. 3A and 3B may be provided with a ferromagnetic element 52 linked to the actuator 42.

Figure 5A:
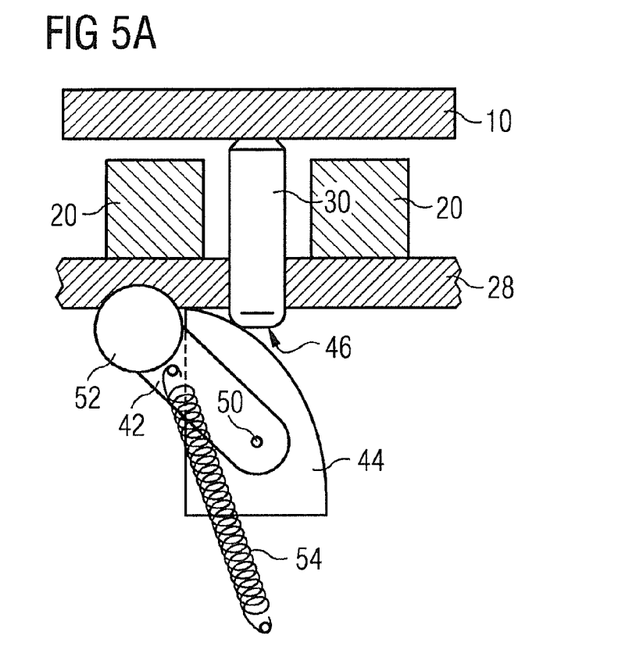
FIGS. 5A, 5B show an example embodiment of the present invention.
Figure 5B:
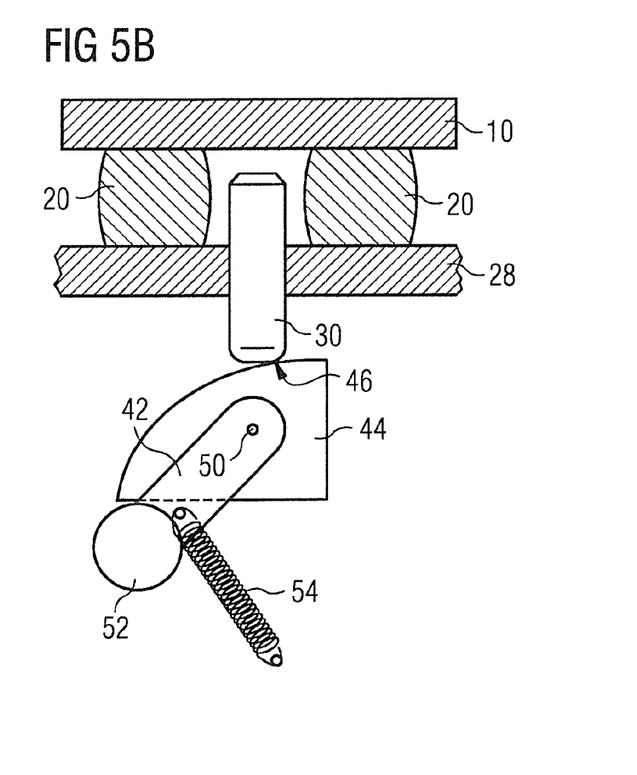

When the magnet is at field, the stray field of the magnet attracts the ferromagnetic element 52 towards the magnet 10, pulling the actuator 42 with it, and driving the driven piece 30 into an uppermost position, shown in FIG. 5A, to provide a rigid mount. When the magnet is de-energized for transport, the attractive force on the ferromagnetic element 52 ceases, and the actuator may return to a rest position such as shown in FIG. 5B, and the driven piece 30 falls to a lower position to change the mounting point to a vibration-damping mount by allowing superconducting magnet structure 10 to rest on vibration damping mounts 20. The actuator may be urged towards a position corresponding to the lower position of the rotatable cam (44) by a return spring, schematically illustrated at 54 in FIGS. 5A, 5B, and/or by gravity, and/or by suitable profiling of the cam which renders the upper position of the driven piece 30 unstable. Such a cam profile is illustrated in FIGS. 5A-5B. Locating pins and/or tapers may be provided for such embodiments, as with the embodiments of FIGS. 3A-3B.

A second set of embodiments provides arrangements in which a gas is used as a vibration isolation medium.

Figure 4A:
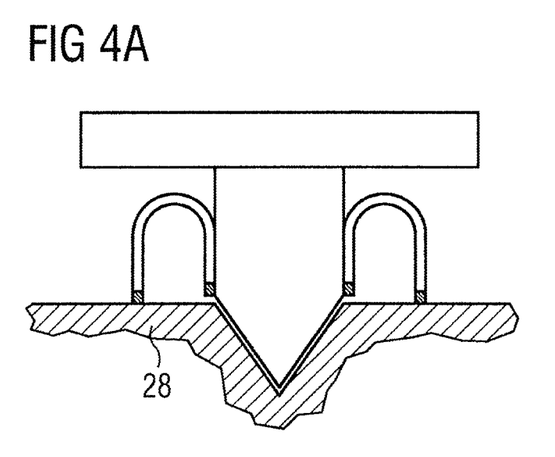
FIGS. 4A, 4B show an example embodiment of the present invention.
Figure 4B:
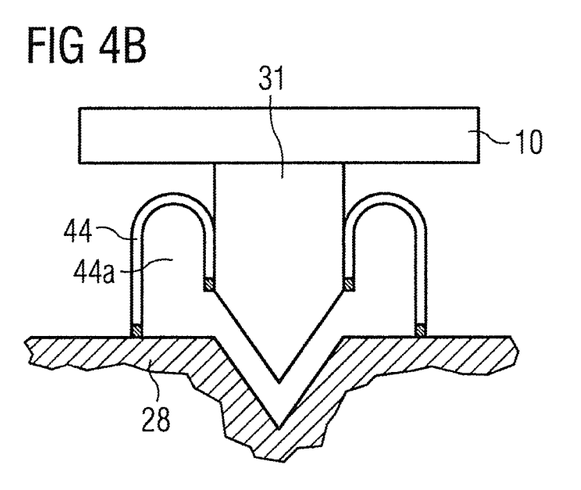

FIGS. 4A, 4B schematically illustrate a mounting point according to another embodiment of the present invention. A support mount 31 is rigidly fixed to the magnet structure 10. An anti-vibration mount 44 is provided surrounding the support mount 31. "Surrounding" may mean encircling, positioned either side of, or positioned at selected locations around. According to this embodiment, anti-vibration mount 44 is inflatable by pressurizing an inside volume 44a with a suitable gas as illustrated in FIG. 4B. The resultant gas spring provides vibration attenuation. FIG. 4A shows the mounting point in its first state, with anti-vibration mount 44 deflated. The superconducting magnet structure 10 is rigidly supported on the support structure 28 by support mount 31. FIG. 4B shows the mounting point in its second state, with anti-vibration mount 44 inflated. The anti-vibration mount is constructed of a flexible material, such as a fabric-reinforced elastomer, and expands such that it lifts superconducting magnet structure 10 and the attached support mount 31 off of the support structure 28. As shown in FIGS. 4A-4B, the anti-vibration mount is arranged in the form of a rolling elastomer diaphragm, but other arrangements are possible. As described with reference to FIGS. 2A-3B, a pin or taper with a corresponding recess may be provided on the support mount 31 and support structure 28 to ensure that the magnet structure returns to the correct position each time.

In a preferred version of this embodiment, the anti-vibration mount 44 is inflated by a compressor powered by a tractor unit driving the mobile carrier. Once the mobile carrier has arrived at a location where the superconducting magnet is required to perform imaging, the tractor unit may be removed, or turned off. The compressor is de-energized, and the anti-vibration mount 44 deflates. The mount then returns to its first state, as FIG. 4A, with the superconducting magnet structure resting on the support mount 31, on the support structure 28.

In a variant of this embodiment, the anti-vibration mount may be inflated hydraulically. This may be achieved by a manually actuated pump, or by a pump powered by a tractor unit driving the mobile carrier. Once the mobile carrier has arrived at a location where the superconducting magnet is required to perform imaging, the tractor unit may be removed, or turned off. The pump is de-energized, and the anti-vibration mount deflates. The mounting point then returns to its first state, as FIG. 4A.

Figure 6A:
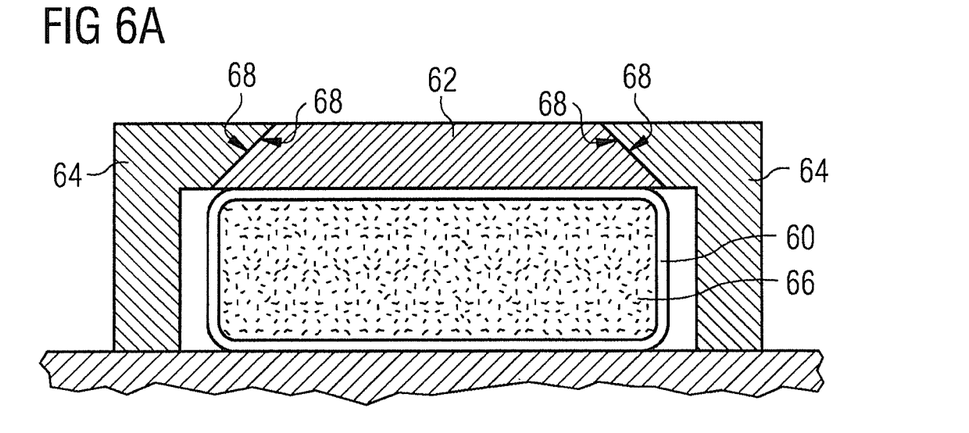
FIGS. 6A, 6B show an example embodiment of the present invention.
Figure 6B:
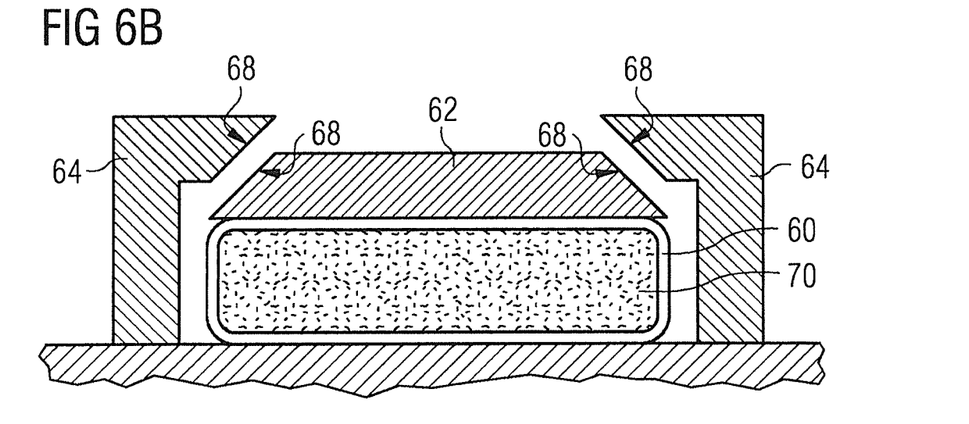

FIGS. 6A, 6B show an example of a mounting point according to another embodiment of the invention. FIG. 6A shows a first state of a mounting point according to this embodiment of the invention. An inflatable part 60 is pressurized with high pressure gas 66 to such a pressure that a rigid bearing surface 62 of the mounting point is pressed firmly into engagement with a limiter 64. In the illustrated example, the limiter surrounds the rigid bearing surface, and engages it with complementary tapers 68 on the rigid bearing surface and the limiter 64. The gas pressure is such that the weight of the magnet is overcome by a significant factor, and the limiter 64 ensures that the mount is securely locked into a fixed position. The retainer prevents any movement of the rigid bearing surface, and the superconducting magnet supported on it. FIG. 6B shows the mounting point in its second state. The gas pressure is reduced to a value that supports the weight of the magnet but provides the spring function necessary to allows movements and absorb vibrations. Preferably, the gas is introduced to such a pressure that expected shock loads on the superconducting magnet will not cause the inflatable part 60 to "bottom out", that is, compress sufficiently that the vibration isolation function is not restricted by upper and lower interior surfaces of the inflatable part 60 coming into contact with one another, but not so high a pressure that the rigid bearing surface 62 contacts the limiter 64.

When in the second state (FIG. 6B), sufficient clearance should be provided to allow an acceptable range of movement of the rigid bearing surface, for example 10 mm in all directions. The superconducting magnet is supported on the rigid bearing surface 62, and vibration isolation is provided by compression of the gas 70 inside the inflatable part 60.

Figure 7A:
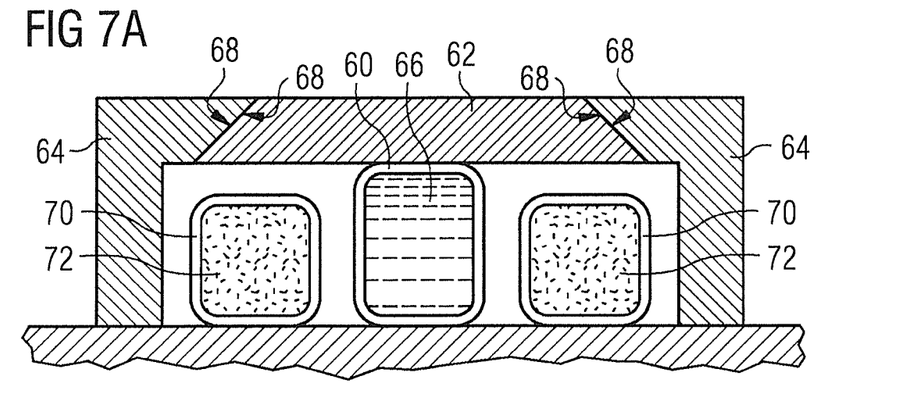
FIGS. 7A, 7B show an example embodiment of the present invention.
Figure 7B:
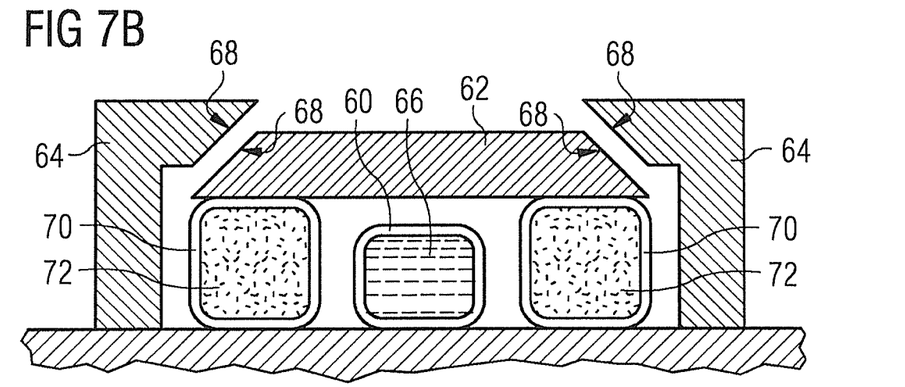
Figure 7C:
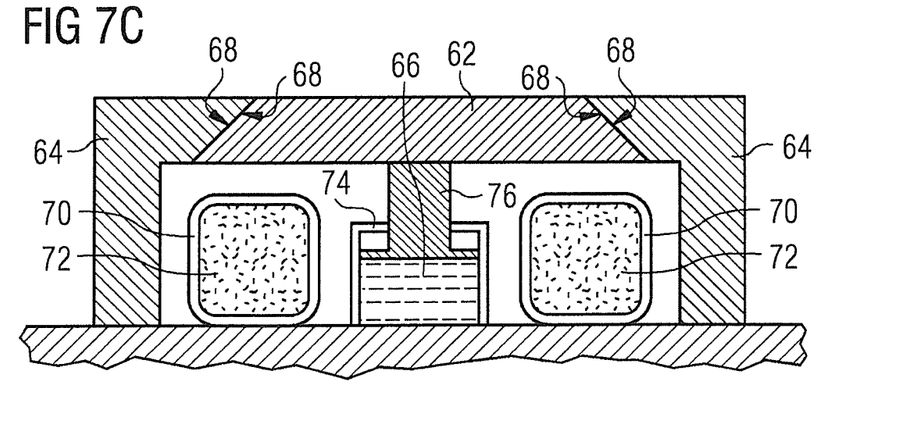
FIG. 7C shows another example embodiment of the present invention.

FIGS. 7A, 7B show an example of a mounting point according to another embodiment of the invention, similar to that of FIGS. 6A, 6B. FIG. 7A shows a first state of a mounting point according to this embodiment of the invention. An inflatable part 60 is filled with a liquid or gas 66 to such a pressure that a rigid bearing surface 62 of the mounting point is pressed up into engagement with a retainer 64. The retainer prevents any movement of the rigid bearing surface, and the superconducting magnet supported on it. The liquid 66 itself is incompressible, and gas, if used instead, is employed under such high pressure as to render it practically incompressible. The liquid or gas 66 thereby prevents any vertical movement of the rigid bearing surface, and the superconducting magnet supported on it. In the illustrated example, the limiter 64 surrounds the rigid bearing surface, and engages it with complementary tapers 68 on the rigid bearing surface 62 and the limiter 64. Limiter 64 ensures that the magnet is securely locked into a fixed position. Next to, or surrounding, the inflatable part 60 are further inflatable parts 70, filled with gas 72. In the first state, shown in FIG. 7A, further inflatable parts 70 do not play any part in supporting the weight of the superconducting magnet on the rigid bearing surface 62, although they may contact the underside of the rigid bearing surface 62. FIG. 7B shows the mount in its second state. Liquid 66 or high pressure gas is removed from the inflatable part 60 to such an extent that the further inflatable parts 72 bear the weight of the superconducting magnet and the inflatable part 60 will not impede the free movement of the rigid bearing surface 62 within a reasonable travel distance, such as 10 mm. The superconducting magnet is supported on the rigid bearing surface 62, and vibration isolation is provided by compression of the gas 70 inside the further inflatable parts 72. Instead of an inflatable part 60, a piston arrangement may be used, hydraulically driven by liquid 66, as illustrated in FIG. 7C. In such an arrangement, the piston 76 must retract into its cylinder 74 sufficiently far that it will not impede the free movement of the rigid bearing surface 62 within a reasonable travel distance, such as 10 mm.

Mounting points according to the present invention must be positioned between the superconducting magnet structure and the structure of the mobile carrier. Typically, four mounting points would be provided for a superconducting magnet structure, one for each foot of a typical design, or one near each corner of a rectangular pallet. The mounts may be provided as part of a pallet, wherein the magnet is loaded onto the pallet after manufacture, and the superconducting magnet remains on that pallet within the mobile carrier, throughout its working life. The superconducting magnet structure itself, in this arrangement, is not modified, and may be the same as is mounted on different types of mounts or pallets in fixed installations. Alternatively, the mounting points of the present invention may be provided as a part of a cradle, supporting the superconducting magnet but itself forming part of the superconducting magnet assembly.

Each of the mounting points according to the present invention achieves its aim of providing vibration mounting for the superconducting magnet when in use, yet providing rigid, precisely-located mounting for the superconducting magnet when not in use.

Although modifications and changes may be suggested by those skilled in the art, it is the intention of the inventors to embody within the patent warranted hereon all changes and modifications as reasonably and properly come within the scope of their contribution to the art.

The invention claimed is:

1. A superconducting magnet structure in combination with a mounting point, wherein the mounting point is controllable between two different states; in a first state, the mounting point provides rigid attachment and precise location of the superconducting magnet structure; and in a second state, the mounting point provides vibration isolation of the superconducting magnet structure, said mounting point comprising:
    a support;
    an anti-vibration mount mounted to the support;
    a rigid mount comprising a threaded drive screw passing through a complementary threaded hole in the support, arranged such that the lower extremity of the drive screw is accessible, and wherein drive screw is operable to drive a driven piece vertically past the anti-vibration mount to achieve the first state of the mounting point in which the driven piece protrudes above the anti-vibration mount, such that the superconducting magnet structure may bear upon the driven piece to provide rigid mounting; and the drive screw is operable to retract to a lower position, out of contact with the superconducting magnet structure such that the superconducting magnet structure may rest on anti-vibration mount in the second state of the mounting point.

2. A superconducting magnet structure in combination with a mounting point according to claim 1 wherein the driven piece is an extension of the drive screw.

3. A superconducting magnet structure in combination with a mounting point according to claim 1 comprising a manually operable activator that causes a transition between the first and second states.

4. A superconducting magnet structure in combination with a mounting point according to claim 3 wherein the cam mechanism comprises a ferromagnetic element linked to an actuator that is arranged to drive the rotatable cam.

5. A superconducting magnet structure in combination with a mounting point according to claim 4 comprising a return spring that urges the actuator toward a position corresponding to the lower position of the rotatable cam.

6. A superconducting magnet structure in combination with a mounting point according to claim 1 comprising a powered actuator that causes a transition between the first and second states.

7. A superconducting magnet structure in combination with a mounting point according to claim 1, comprising an alignment pin provided on an upper extremity of driven piece, which engages a complementary recess in the superconducting magnet structure.

8. A superconducting magnet structure in combination with a mounting point, wherein the mounting point is controllable between two different states; in a first state, the mounting point provides rigid attachment and precise location of the superconducting magnet structure; and in a second state, the mounting point provides vibration isolation of the superconducting magnet, said mounting point comprising:
    a rigid mount mounted to the support;
    an anti-vibration mount arranged to be driven by a threaded drive screw passing through a complementary threaded hole in the support, arranged such that the lower extremity of the drive screw is accessible, wherein drive screw is operable to drive the anti-vibration mount vertically past the rigid mount to achieve the second state of the mounting point in which the anti-vibration mount protrudes above the rigid mount, such that the superconducting magnet structure may bear upon the vibration mount; and
    the drive screw is operable to retract to a lower position, such that the superconducting magnet structure may rest on rigid mount in the first state of the mounting point.

9. A superconducting magnet structure in combination with a mounting point according to claim 8 comprising a manually operable activator that causes a transition between the first and second states.

10. A superconducting magnet structure in combination with a mounting point according to claim 8 comprising a powered actuator that causes a transition between the first and second states.

11. A superconducting magnet structure in combination with a mounting point according to claim 8, comprising an alignment pin is provided on an upper extremity of rigid mount, which engages with a complementary recess in the superconducting magnet structure.

12. A superconducting magnet structure in combination with a mounting point according to claim 11, comprising a taper is provided on the rigid mount, with a complementary recess formed on the superconducting magnet structure.

13. A superconducting magnet structure in combination with a mounting point according to claim 8, comprising a taper is provided on the superconducting magnet structure, with a complementary recess formed on the rigid mount.

* * * * *